United States Patent
Abella et al.

(10) Patent No.: US 7,577,015 B2
(45) Date of Patent: Aug. 18, 2009

(54) MEMORY CONTENT INVERTING TO MINIMIZE NTBI EFFECTS

(75) Inventors: Jaume Abella, Barcelona (ES); Xavier Vera, Barcelona (ES); Javier Carretero Casado, Barcelona (ES); Jose-Alejandro Pineiro, Barcelona (ES); Antonio Gonzalez, Barcelona (ES)

(73) Assignee: Intel Corporation, Santa Clara, CA (US)

( * ) Notice: Subject to any disclaimer, the term of this patent is extended or adjusted under 35 U.S.C. 154(b) by 221 days.

(21) Appl. No.: 11/731,184

(22) Filed: Mar. 30, 2007

(65) Prior Publication Data

US 2008/0244182 A1     Oct. 2, 2008

(51) Int. Cl.
*G11C 11/00*     (2006.01)
*G11C 8/00*      (2006.01)
*G06F 13/00*     (2006.01)

(52) U.S. Cl. .................. 365/154; 365/230.05; 711/131; 711/144; 711/145; 711/156

(58) Field of Classification Search .................. 365/154, 365/230.05; 711/131, 144, 145, 156
See application file for complete search history.

(56) References Cited

U.S. PATENT DOCUMENTS

| | | | | |
|---|---|---|---|---|
| 4,843,542 A | * | 6/1989 | Dashiell et al. | 711/119 |
| 2003/0016562 A1 | * | 1/2003 | Im | 365/189.02 |
| 2003/0076719 A1 | * | 4/2003 | Byeon et al. | 365/200 |
| 2005/0018519 A1 | * | 1/2005 | Nii | 365/227 |
| 2005/0078519 A1 | * | 4/2005 | Shiga | 365/185.17 |
| 2005/0232011 A1 | * | 10/2005 | Lee et al. | 365/185.12 |
| 2006/0245247 A1 | * | 11/2006 | Yano et al. | 365/185.08 |

* cited by examiner

*Primary Examiner*—Ly D Pham
(74) *Attorney, Agent, or Firm*—Ryder IP Law; Douglas J. Ryder

(57) ABSTRACT

In general, in one aspect, the disclosure describes an apparatus that includes a memory device having a plurality of memory cells. An inverter is used to invert data and tag information destined for the memory device. A register is used to capture the inverted data and tag information. A write inverted value logic is used to determine when to enable writing the inverted data and tag information from the register to the memory device. When inverted data and tag information is written to a memory cell the memory cell is invalidated.

9 Claims, 3 Drawing Sheets

MEMORY CONTENT INVERTING TO MINIMIZE NTBI EFFECTS

BACKGROUND

Circuits become more vulnerable as technology evolves because transistors shrink (length, width and thickness). Negative Bias Temperature Instability (NBTI) is a failure that affects positive channel transistors (e.g., PMOS) when the voltage at a gate of the transistor is negative.

FIG. 1 illustrates an example memory cell 100. The memory cell 100 includes two inverters 110, 120 connected in a ring manner so that one of the inverters will always have a negative voltage (logic value "0") for an input while the other has a positive voltage (logic value "1") for an input. As the inverters 110, 120 include PMOS transistors 112, 122, one of the PMOS transistors will always have a negative voltage applied to the gate while the other has a positive voltage applied to the gate. Accordingly, at all times one of the PMOS transistors in the memory cell 100 will be degrading while the other is not.

The best case degradation happens when the value in each inverter is "0" for 50% of the time so that each of the PMOS transistors degrades the same. However, if the activity patterns of the memory cells do not produce such a result, one PMOS may degrade more then the other. Whenever one transistor fails, the piece of logic becomes useless. Activity patterns for the different cache-like structures show significant imbalance because some of the bits are "0" most of the time.

BRIEF DESCRIPTION OF THE DRAWINGS

The features and advantages of the various embodiments will become apparent from the following detailed description in which.

DETAILED DESCRIPTION

To extend the life of memory cells, the degradation of the positive channel transistors (e.g., PMOS) needs to be balanced. That is, the contents stored in the memory cells need to be balanced between "0" and "1". Ideally, the memory cells would store each value 50% of the time. However, the value of the data written to the cell is based on the operation of a program (or programs) writing to the memory device and may not be balanced. The data stored in the memory cells can periodically be inverted and the inverted data can be written to the memory cell to help balance the contents of the cell and the degradation of the PMOS transistors. The inverted data can be written to the memory cells when the memory cell is not busy (e.g., writing data, reading data). When the inverted data is stored in the cell, the contents are invalidated so that the inverted data will not be read from the memory cell by the program(s).

The inverting and invalidating of data in memory cells within a memory device (e.g., cache) may affect the performance of program(s) utilizing the memory device. If the program(s) attempt to read data from an inverted and invalidated memory cell a cache miss will result and the data will need to be fetched from other levels of the memory hierarchy. However, if the inverted and invalidated data in a memory cell is evicted and replaced by new data prior to a read of the memory cell there will be no impact on the performance of the program(s).

Figure 1:
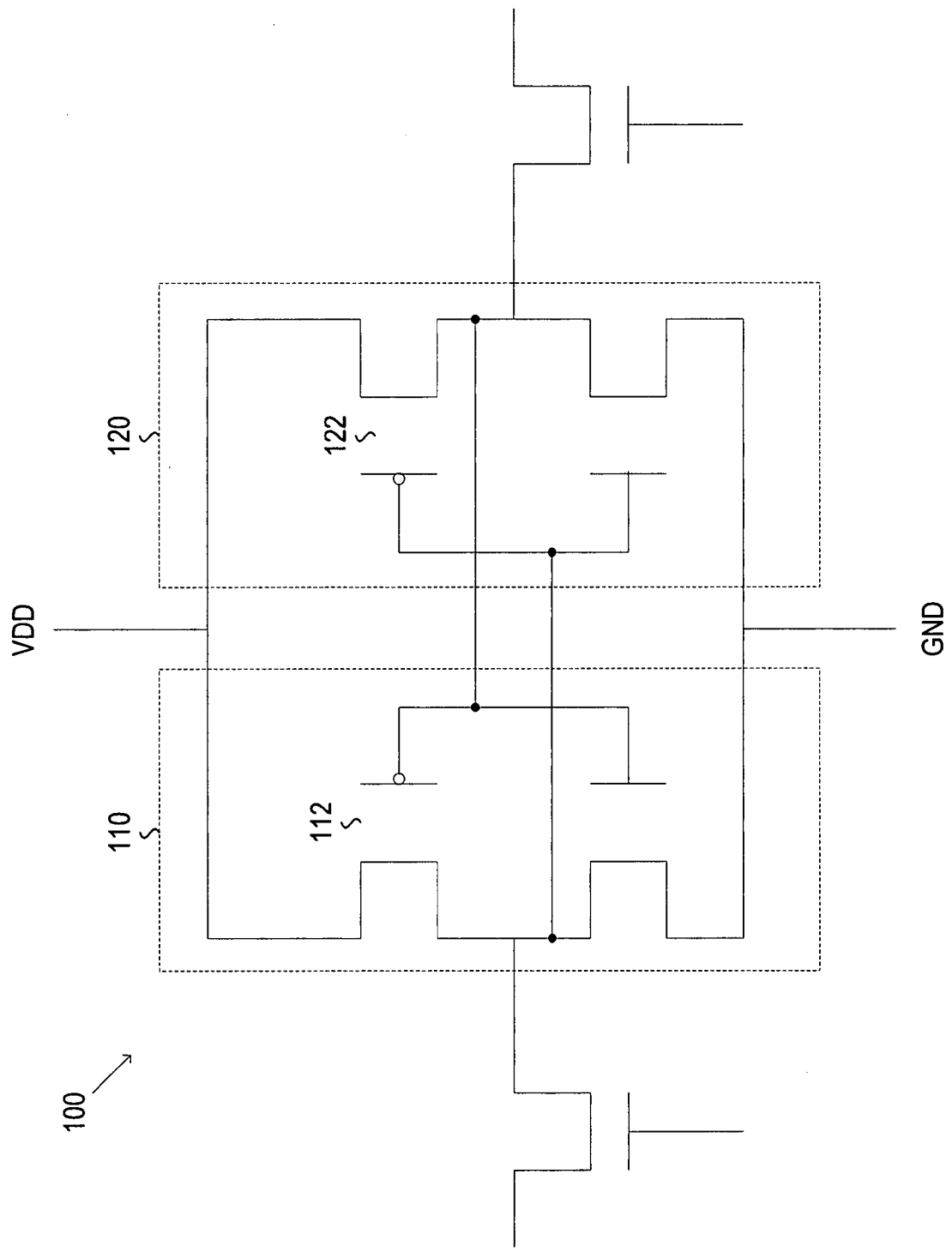
FIG. 1 illustrates an example memory cell, according to one embodiment.
Figure 2:
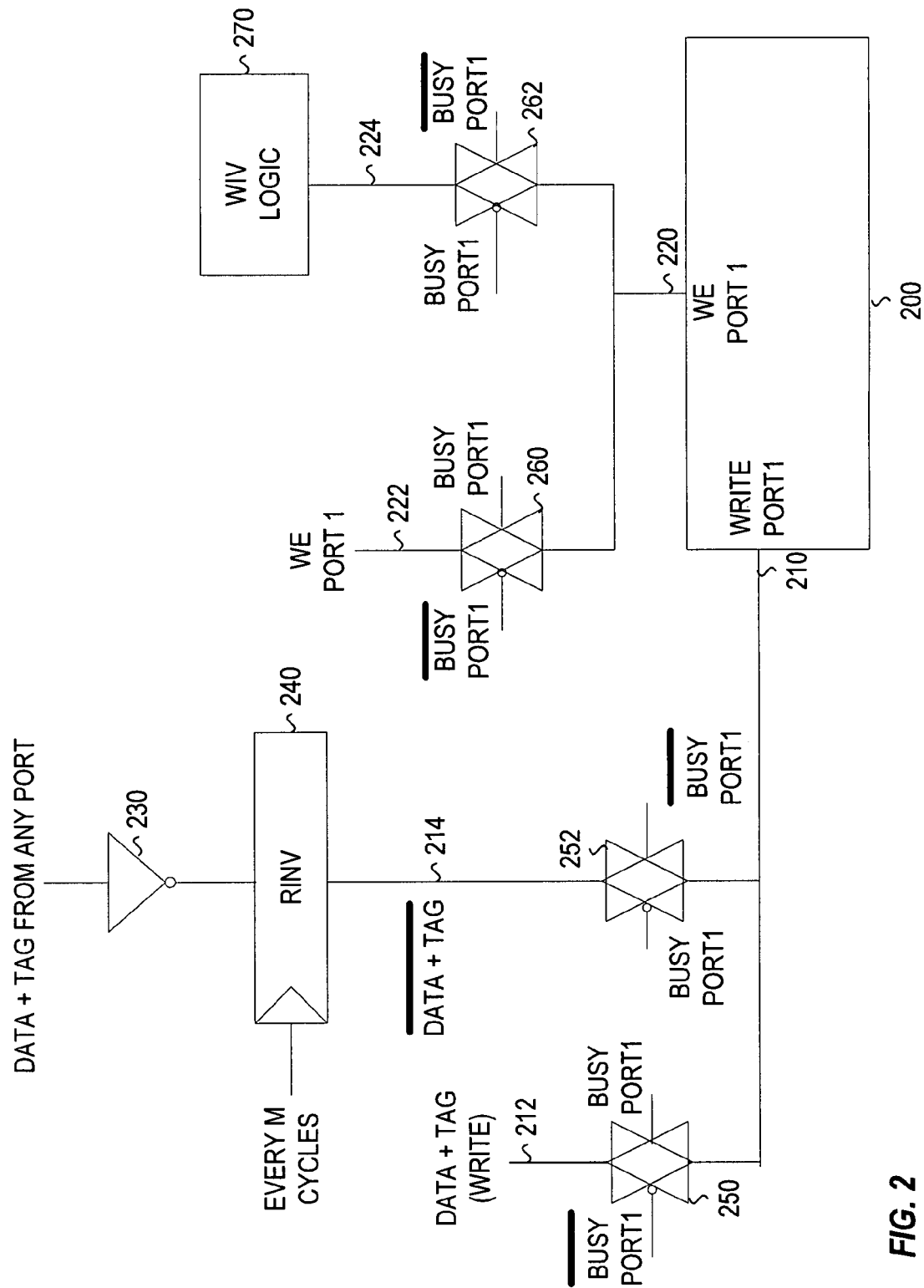
FIG. 2 illustrates an example mechanism to write inverted values to a memory device (e.g., cache), according to one embodiment.

FIG. 2 illustrates an example mechanism to write inverted values to a memory device (e.g., cache) 200. The memory device 200 includes a plurality of write ports 210 and a plurality of write enable (WE) ports 220 that are utilized to write data to the appropriate memory cells (not illustrated) within the memory device 200. The write ports 210 are coupled to respective write lines 212 to receive data and tag information and respective invert lines 214 to receive inverted data and tag information. The write enable ports 220 are coupled to respective write enable lines 222 to receive write enable signals to write data and tag information and respective invert enable lines 224 to receive invert enable signals to write inverted data and tag information. For ease of illustration only a single write port 210 (write port 1) coupled to a single write line 212 and a single invert line 214, and a single WE port 220 (WE port 1) coupled to a single write enable line 222 and a single invert enable line 224 are illustrated.

Data and tag information destined for any memory cell may be captured from any bus sending data (e.g., full cache lines) to the memory device 200. The captured data may be inverted by inverter(s) 230 and the inverted data may be stored in a register 240. Alternatively, the data may be captured in the register 240 and the inverter(s) may invert the data subsequently. The register 240 may hold the inverted data destined for all the write ports 210 in the memory device 200. The register 240 contents may be updated every time the memory device 200 fetches a cache line from an upper level cache (or main memory), once every X (e.g., 1,000) times a cache line is fetched, or periodically (e.g., once every M cycles). By capturing the data in the register 240 the actual cache contents do not need to be read in order to invert the data stored therein.

The register 240 may be connected to the write ports 210 via the invert lines 214. Utilizing the same write port 210 to write the data and tag information or the inverted data and tag information allows inverted data to be written to the memory device 200 without modifications thereto (e.g., additional ports, additional circuitry). Utilizing the invert line 214 to provide the inverted data ensures the write line 212 is not affected (e.g., logic to invert data is not on write critical path). In order to ensure no conflicts between the write line 212 and the invert line 214 passgates 250, 252 respectively may be utilized.

The passgates 250, 252 are controlled by busy signals associated with the port. When a port is busy, the passgate 250 will enable the write line 212 (allow data to be written thereto) while the passgate 252 will disable the invert line 214 (prevent inverted data from being written thereto). When the port is not busy the passgate 250 will disable the write line 212 while the passgate 252 will enable the invert line 214. The passgate 250 should be activated in advance of a write action in such a way that it does not introduce any extra delay on the write line 212.

Write inverted value (WIV) logic 270 determines when inverted data is eligible to be written to the memory cells. The WIV logic 270 may activate a WIV enable signal (e.g., set to 1) when the memory device 200 is capable of receiving inverted data. The WIV logic 270 is connected to the write enable ports 220 via the invert enable lines 224. Utilizing the same write enable port 220 to provide a write enable signal or a WIV signal allows the appropriate enable signal to be provided to the memory device 200 without needing additional ports. Utilizing the invert enable line 224 to provide the WIV signal ensures the enable line 222 is not affected (e.g., WIV logic 270 is not on write enable critical path). In order to ensure no conflicts between the write enable line 222 and the invert enable line 224 passgates 260, 262 respectively may be utilized. The passgates 260, 262 operate in the same fashion as the passgates 250, 252 (e.g., when the port is busy the passgate 262 will disable the invert enable line 224).

For ideal balancing of a memory cell, the contents would be inverted 50% of the time. If the contents of the memory cell are inverted 50% of the time, the contents written to the cell need not be known in order to balance the data stored therein. However, in order to invert a cell 50% of the time knowledge of how long data was to be stored therein and/or when the data stored therein was to be overwritten may be required. In order to approximate the amount of time that a memory cell is inverted, a target percentage (e.g., 50%) of the memory cells may be enabled to be inverted at any time and the target percentage of memory cells may be inverted on average. Inverting the target percentage of memory cells on average may result in the memory cells being inverted approximately the target percentage of the time. It should be noted that a target percentage of 50% may result in ideal balancing of the memory cells but the target percentage is not limited thereto. Rather any target percentage can be utilized without departing from the current scope.

The write enable ports 220 that are not busy will receive the WIV signal. When the WIV signal is activated, the non busy ports will be eligible for inverting. The associated write ports 210 may snoop the register 240 for inverted data. The write ports 210 that have inverted data written thereto will have the data invalidated so the inverted data is not read. The data may be invalidated in any number of ways that are all within the current scope. For example, the WIV logic 270 may somehow invalidate the cell or cause the cell to be invalidated. The memory device 200 may be informed about the inverted data or detect the inverted data and invalidate the cell data based thereon. The inverted data may be invalidated by activating (e.g., setting to 1) an invalid bit or by deactivating (e.g., set to 0) a valid bit.

The WIV logic 270 may include a counter to track the number of memory cells that are inverted and have a threshold value stored therein that the counter is compared to. The WIV logic 270 may activate the signal until the threshold is achieved (e.g., certain percentage, certain number) at which point the WIV signal may be deactivated (e.g., set to 0). When the WIV signal is deactivated no more memory cells will be eligible to have their contents inverted and invalidated (non-busy ports remain idle). When data and tag information is written to a memory cell that had inverted and invalidated data the count may be reduced accordingly. If the count is reduced below the threshold, the WIV logic 270 may reactivate the WIV signal thus enabling additional memory cells to have inverted data written thereto and be invalidated.

The percentage of memory cells that may be inverted and invalidated may be a fixed percentage or may be dynamic. Using a fixed invert ratio allows for a simpler implementation. However, a fixed percentage does not provide flexibility to adjust the percentage up or down based on the use of the memory device (cache) by different programs. For example, inverting 50% of memory cells in an attempt to ideally balance the cells may result in excessive cache misses for programs that make an effective use of a large percentage of cache space (e.g., the data stored therein will be used by the program before being discarded for new data). Alternatively, inverting a lower fixed percentage (e.g., 25%) may eliminate some of the cache misses but may not efficiently limit the NBTI degradation.

Using an invert ratio that dynamically changes may improve performance (e.g., minimize cache misses) while still minimizing NBTI degradation. The invert ratio (K) may be low for programs that use most of the cache and high for programs using a small fraction of the cache space. For example, a possible implementation may start at a default value above the ideal 50% (e.g., K=60%), and deactivate the inverting (e.g., K=0%) for those programs where the performance loss is expected to be significant if the default value is used. As the dynamic ratio switches between the default value and being off, on average the ratio may end up being in the ideal 50% range.

In order to determine when the dynamic ratio should switch (e.g., from the default, K=60%, to off, K=0%) a mechanism may be needed to detect the impact of inverting on the memory device 200 usage. That is, a determination needs to be made regarding whether inverting and invalidating memory cells impacts the performance of a program utilizing the memory device 200 (e.g., excess cache misses). The cache misses caused by data being inverted and invalidated may be tracked (e.g., number of cache misses, percentage of cache misses) and compared to a threshold (e.g., number of cache misses, percentage of cache misses). If the threshold is met or exceeded the inverting may be deactivated (e.g., switch to K=0%).

The impact the inverting scheme has on performance of the memory device 200 for particular programs running may be determined prior to actually implementing the inverting scheme. That is, a performance impact measurement may be obtained while the program is running without actually implementing the inverting scheme. If the performance impact measurement does not exceed the threshold (performance impact) the inverting scheme may be implemented. An extra bit may be added per cache line to indicate if the cache line would have been inverted if the mechanism was activated (e.g., set to 1 if would be inverted). If a hit happens (e.g., read) in a cache line that would have been inverted this may be counted as an induced extra miss. After the program runs a certain number of steps a determination is made as to whether the inverting scheme should be activated. The determination may be made by comparing the induced misses to the threshold. The impact assessment may be repeated periodically to decide whether the mechanism is activated or deactivated during the next period.

The performance measurement used for determining whether to activate the inversion scheme has been described with respect to cache misses but is not limited thereto. Rather any performance measurement indicator that can accurately reflect the impact that inverting and invalidating the data has on performance is within the current scope.

While the dynamic inverting ratio was described with respect to either being on (e.g., K=60%) or off (K=0%) it is not limited thereto. Rather, any number of K values may be utilized that may be based on varying degrees of performance loss level without departing from the scope. For example, if the performance loss is less than 1% then K=60%, if the performance loss is between 1-2% then K=40%, if the performance loss is between 2-3% then K=20%, and if the performance loss is greater than 3% then K=0%, The selection of the memory cells (write ports 210) for inversion may be based on varying levels of granularity (e.g., set, way, line, or intra-line). The memory cells may be selected randomly, according to an algorithm (e.g., round robin), or based on information provided by a replacement policy (e.g., least recently used (LRU), most recently used (MRU)). If the selection is based on the replacement policy information, the memory cells selected may be the LRU memory cells as these memory cells are more likely to be evicted (discarded for other data) before they are ever used (read). This approach is likely to have a minimal performance penalty, taking into account that most of the cache access hits occur in the MRU position of the cache sets. Regarding of how the memory cells are selected the ratio of memory cells that are inverted may be based on the fixed or dynamic ratio discussed above.

Selecting sets to be inverted (and invalidated) without changing the address mapping function may result in extra cache misses for all the addresses mapped to the invalid sets. Accordingly, selecting sets of memory cells for inversion may be done in conjunction with a memory device 200 where the mapping function can be dynamically changed.

Selecting ways to be inverted (and invalidated) does not require changing the mapping function because all the sets may still have a number of other ways valid. However, it requires that individual cache ways may be temporarily disabled for allocation on a miss.

Selecting individual cache lines to be inverted provides flexibility as the lines need not be based on any particular sets or ways. In fact, selecting based on cache line may result in no particular set or way being invalidated (no need to worry about remapping addresses or ways being disabled for cache misses).

Parts of cache lines could be also considered to be invalidated and inverted (e.g., half of each cache line). However, such an alternative could be quite complex in terms of hardware.

The mechanism 200 may be implemented in any number of memory devices and the memory devices having the mechanism 200 implemented may be utilized in any number of systems.

Figure 3:
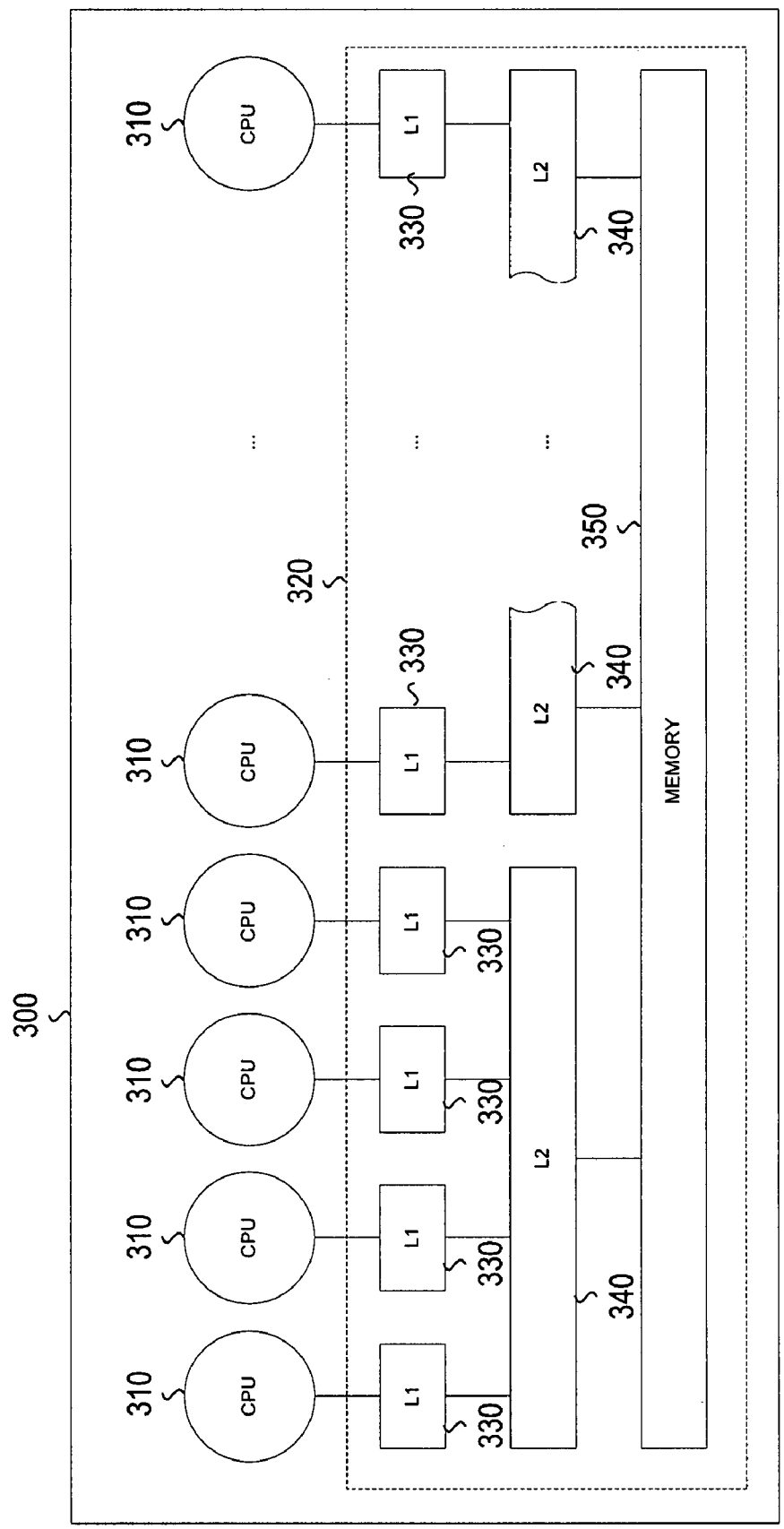
FIG. 3 illustrates a block diagram of an example system utilizing a mechanism to write inverted values, according to one embodiment.

FIG. 3 illustrates a block diagram of an example computing system 300. The system 300 includes a plurality of CPUs 310 and a shared memory hierarchy 320. The memory hierarchy 320 may include a first level cache 330 associated with each CPU 310, a second level cache 340 associated with a group (e.g., four) of CPUs 310, and shared memory 350. The mechanism for writing inverted values (e.g., 200 of FIG. 2) may be implemented within one or more levels of the memory hierarchy 320.

Although the disclosure has been illustrated by reference to specific embodiments, it will be apparent that the disclosure is not limited thereto as various changes and modifications may be made thereto without departing from the scope. Reference to "one embodiment" or "an embodiment" means that a particular feature, structure or characteristic described therein is included in at least one embodiment. Thus, the appearances of the phrase "in one embodiment" or "in an embodiment" appearing in various places throughout the specification are not necessarily all referring to the same embodiment.

The various embodiments are intended to be protected broadly within the spirit and scope of the appended claims.

What is claimed:

1. An apparatus comprising
a memory device having a plurality of memory cells;
one or more inverters to invert data destined for the memory device;
a write inverted value logic to determine when to enable writing the inverted data to the memory device, wherein inverted data is to be written to one or more memory cells when enabled, wherein the write inverted value logic is to enable writing inverted data to a percentage of the memory cells, wherein the percentage is a dynamic parameter based on performance of the memory device, wherein the performance is measured by cache misses, and wherein the memory device is to invalidate the one or more memory cells when inverted data is written thereto.

2. The apparatus of claim 1, wherein the data includes tag information.

3. The apparatus of claim 1, further comprising a register to capture the inverted data, wherein the inverted data is to be written from the register to the memory cells when enabled.

4. The apparatus of claim 1, in combination with a plurality of processors and shared volatile memory.

5. An apparatus comprising
a memory device having a plurality of memory cells, wherein the memory device includes
a plurality of write ports and a plurality of write enable ports, wherein the write ports and the write enable ports are to write data to respective memory cells; and further comprising
a plurality of write lines, coupled to respective ones of the plurality of write ports, to write the data and tag information to respective ones of the plurality of memory cells;
a plurality of invert lines, coupled to respective ones of the plurality of write ports, to write the inverted data and tag information to respective ones of the plurality of memory cells;
a plurality of write enable lines, coupled to respective ones of the plurality of write enable ports, to enable respective ones of the plurality of write lines; and
a plurality of invert enable lines, coupled to respective ones of the plurality of write enable ports, to enable respective ones of the plurality of invert lines, wherein the write lines and the write enable lines include a first type of passgate and the invert lines and the invert enable lines include a second type of passgate, wherein the first and the second type of passgates are to prevent conflict between writing data and writing inverted, wherein the first type of passgates are to enable data to be written when an associated port is busy and the second type of passgates are to enable inverted data to be written when an associated port is not busy;
one or more inverters to invert data destined for the memory device;
a write inverted value logic to determine when to enable writing the inverted data to the memory device, wherein inverted data is to be written to one or more memory cells when enabled, and wherein the memory device is to invalidate the one or more memory cells when inverted data is written thereto.

6. A method comprising
inverting data destined for a memory device;
determining when to enable writing the inverted data to the memory device, wherein the determining includes enabling a percentage of the memory cells to be inverted based on performance of the memory device, wherein the performance is based on cache misses;
writing the inverted data to memory cells within the memory device; and
invalidating memory cells when inverted data and tag information is written thereto.

7. The method of claim 6, wherein the data includes tag information.

8. The method of claim 6, further comprising capturing the inverted data in a register, and wherein the writing includes writing the inverted data from the register.

9. The method of claim 8, wherein the memory device is a cache.

* * * * *